(12) United States Patent
Peterson et al.

(10) Patent No.: US 8,978,747 B2
(45) Date of Patent: Mar. 17, 2015

(54) DEICING LOUVERS FOR DATACENTER APPLICATIONS

(75) Inventors: Eric C Peterson, Woodinville, WA (US); Christian L. Belady, Mercer Island, WA (US)

(73) Assignee: Microsoft Corporation, Redmond, WA (US)

( * ) Notice: Subject to any disclaimer, the term of this patent is extended or adjusted under 35 U.S.C. 154(b) by 1080 days.

(21) Appl. No.: 12/982,884

(22) Filed: Dec. 31, 2010

(65) Prior Publication Data

US 2012/0168145 A1   Jul. 5, 2012

(51) Int. Cl.
*H05K 7/00* (2006.01)
*F24F 12/00* (2006.01)
*F24F 13/00* (2006.01)
*H05K 7/20* (2006.01)
*F24F 13/14* (2006.01)
*F24F 11/00* (2006.01)

(52) U.S. Cl.
CPC ........ *H05K 7/20745* (2013.01); *H05K 7/20836* (2013.01); *F24F 13/14* (2013.01); *F24F 2011/0087* (2013.01); *Y10S 165/909* (2013.01)
USPC .................. 165/287; 165/54; 165/66; 165/86; 165/96; 165/98; 165/104.33; 165/909; 361/695; 361/696; 361/699; 361/701

(58) Field of Classification Search
USPC ................... 165/86, 96, 98, 909, 54, 66, 287; 165/104.33; 49/86.1; 361/695, 696, 699; 361/701
See application file for complete search history.

(56) References Cited

U.S. PATENT DOCUMENTS

| 2,153,359 | A | * | 4/1939 | Anderson et al. ............. 454/107 |
| 2,310,086 | A | * | 2/1943 | Howard .......................... 165/86 |
| 3,926,249 | A | * | 12/1975 | Glancy .......................... 165/909 |
| 3,968,833 | A | * | 7/1976 | Strindehag et al. ........... 165/909 |
| 4,297,818 | A |   | 11/1981 | Anderson |

(Continued)

FOREIGN PATENT DOCUMENTS

| JP | 08086534 A | * | 4/1996 |
| JP | 2001311368 A | * | 11/2001 |

(Continued)

OTHER PUBLICATIONS

"Yahoo Computing Coop: Shape of Things to Come?", Retrieved at <<http://www.datacenterknowledge.com/archives/2010/04/26/yahoo-computing-coop-the-shape-of-things-to-come/ >>,Apr. 26, 2010, pp. 1-11.

*Primary Examiner* — John Ford
(74) *Attorney, Agent, or Firm* — Steve Wight; Judy Yee; Micky Minhas

(57) ABSTRACT

A datacenter may use heat collected from a heat exchanger at the exhaust portion of a cooling system to heat inlet louvers for an atmospheric intake. The louvers may have fluid passages through which heated fluid may pass and cause the louvers to heat up. The heated louvers may operate during periods of snow, rain, high humidity, or other conditions to eliminate condensation, snow and ice buildup, or other problems. In some embodiments, a liquid may be passed through the louvers, while in other embodiments, heated air or other gas may be passed through conductive paths in the louvers. In a heated air system, holes in the louvers may allow the heated air to enter the incoming airstream to regulate the incoming temperature to the datacenter.

7 Claims, 7 Drawing Sheets

(56) References Cited

U.S. PATENT DOCUMENTS

| | | | |
|---|---|---|---|
| 5,806,582 A * | 9/1998 | Santavuori et al. ........... | 165/909 |
| 6,539,728 B2 | 4/2003 | Korin | |
| 6,557,362 B1 | 5/2003 | Wilson | |
| 7,031,154 B2 | 4/2006 | Bash et al. | |
| 7,051,946 B2 | 5/2006 | Bash et al. | |
| 2004/0060319 A1 | 4/2004 | Wood | |
| 2008/0055846 A1 | 3/2008 | Clidaras et al. | |
| 2009/0216910 A1 | 8/2009 | Duchesneau | |

FOREIGN PATENT DOCUMENTS

| | | | |
|---|---|---|---|
| JP | 2002206874 A | * | 7/2002 |
| JP | 2008281240 A | * | 11/2008 |
| WO | WO 2004065860 A1 | * | 8/2004 |

* cited by examiner

DEICING LOUVERS FOR DATACENTER APPLICATIONS

BACKGROUND

Datacenters consume large amounts of energy and generate large amounts of heat. Many datacenters use airflow as a cooling mechanism, which often use external or atmospheric air to cool portions of the datacenters.

SUMMARY

A datacenter may use heat collected from a heat exchanger at the exhaust portion of a cooling system to heat inlet louvers for an atmospheric intake. The louvers may have fluid passages through which heated fluid may pass and cause the louvers to heat up. The heated louvers may operate during periods of snow, rain, high humidity, or other conditions to eliminate condensation, snow and ice buildup, or other problems. In some embodiments, a liquid may be passed through the louvers, while in other embodiments, heated air or other gas may be passed through conductive paths in the louvers. In a heated air system, holes in the louvers may allow the heated air to enter the incoming airstream to regulate the incoming temperature to the datacenter.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Figure 1:
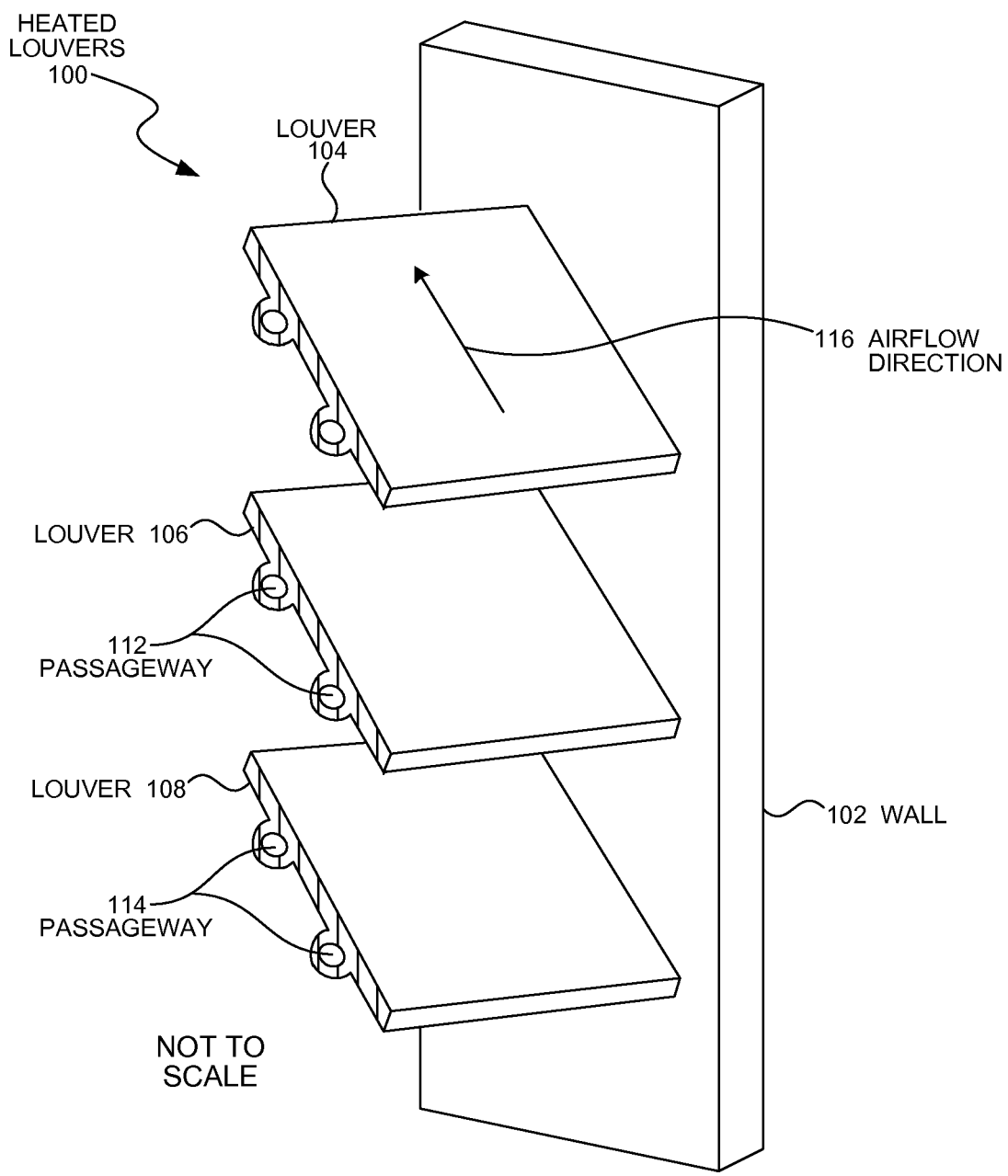
FIG. 1 is a perspective diagram of an example embodiment showing a set of heated louvers.

A datacenter may use heat generated from computers in a datacenter to heat a set of louvers on an inlet to a cooling system for the computers. The heated louvers may operate to remove snow, ice, or other precipitation from the louvers. In some cases, the heated louvers may preheat intake air into the cooling system.

The heated louvers may be constructed with a passageway for a heat transfer medium, such as a fluid or gas. The passageway may be pressurized and may allow the heat transfer to flow through the length of a louver to heat the louver.

In some embodiments, the louvers may be rotatable about a rotation axis. In such embodiments, the passageway may be created through the rotation axis. Rotatable louvers may have a mechanism by which the louvers may be closed.

Throughout this specification, like reference numbers signify the same elements throughout the description of the figures.

When elements are referred to as being "connected" or "coupled," the elements can be directly connected or coupled together or one or more intervening elements may also be present. In contrast, when elements are referred to as being "directly connected" or "directly coupled," there are no intervening elements present.

The subject matter may be embodied as devices, systems, methods, and/or computer program products. Accordingly, some or all of the subject matter may be embodied in hardware and/or in software (including firmware, resident software, micro-code, state machines, gate arrays, etc.) Furthermore, the subject matter may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be for example, but not limited to, an electronic, magnetic, optical, electromagnetic, infrared, or semiconductor system, apparatus, device, or propagation medium. By way of example, and not limitation, computer-readable media may comprise computer storage media and communication media.

Computer storage media includes volatile and nonvolatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and maybe accessed by an instruction execution system. Note that the computer-usable or computer-readable medium can be paper or other suitable medium upon which the program is printed, as the program can be electronically captured via, for instance, optical scanning of the paper or other suitable medium, then compiled, interpreted, of otherwise processed in a suitable manner, if necessary, and then stored in a computer memory.

Communication media typically embodies computer-readable instructions, data structures, program modules or other data in a modulated data signal such as a carrier wave or other transport mechanism and includes any information delivery media. The term "modulated data signal" can be defined as a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above-mentioned should also be included within the scope of computer-readable media.

When the subject matter is embodied in the general context of computer-executable instructions, the embodiment may comprise program modules, executed by one or more systems, computers, or other devices. Generally, program modules include routines, programs, objects, components, data structures, and the like, that perform particular tasks or implement particular abstract data types. Typically, the functionality of the program modules may be combined or distributed as desired in various embodiments.

FIG. 1 is a perspective diagram of an embodiment 100, showing a set of heated louvers. Embodiment 100 is not to scale.

Embodiment 100 illustrates a wall 102 of an inlet system with louvers 104, 106, and 108. The louvers may have passageways 110, 112, and 114, respectively, and may be oriented to receive airflow in the direction 116.

The passageways may be constructed to allow a heat transfer medium, such as a fluid or gas, to pass through the respective louver. In one use scenario, the louver may be heated above a freezing point so that snow or ice may melt from the louver.

In another use scenario, the louvers may be warmed to reduce condensation on the louvers. In some situations, airflow may speed up across the louvers, which may cause a temperature drop and condensation to form.

In still another use scenario, the louvers may be warmed heat the incoming air. In some environments with very low outdoor temperatures, the ambient outdoor air may have a lower temperature than the lowest operating temperature of computer systems in a datacenter. In such a case, the louvers may be part of a mechanism that may warm the incoming air.

The passageways may be outfitted with fittings so that pressurized heat transfer medium may be pumped through the passageways. In a typical embodiment, various plumbing fittings may connect the passageways to input and output paths through the wall 102.

The heat transfer medium may be any type of media, including air or a liquid. A typical liquid heat transfer medium may be an anti-freeze aqueous solution, although other media may be used. A liquid heat transfer medium may be heated by a heat exchanger at the exhaust portion of a forced air circuit, where the forced air circuit may draw air across the computers in a datacenter to extract heat from the computers.

In a system that uses hot air to heat the louvers, a similar forced air circuit may draw air across the computers of the datacenter to create heated air. The heated air may be bled off and plumbed to the louvers.

The construction of the louvers may be from an extruded material, which may be metallic or non-metallic. A metallic version may be extruded aluminum, for example. Extruded embodiments may be manufactured from a single part that may have minimal machining or other secondary processing. Other embodiments may be manufactured by machining, forming, or other manufacturing processes.

In some cases, a louver may be manufactured from an assembly of parts, which may be extruded, stamped, formed, machined, or manufactured from some other process. A louver may be assembled by bonding, welding, fastening, snap fitting, or other assembly process. In such cases, a louver may be manufactured from two or more different materials.

In general, a louver may have a cross section that may be from less than an inch wide to several inches wide and a fraction of an inch thick to several inches thick. The louver may be many inches or even feet long. In many embodiments, the length of the louver may be 10, 20, or more times longer than the width of the louver.

The actual design of the louver may depend on the specific installation. A set of louvers may be placed before or after a screen or filter system. In many cases, the louvers may be the first of several components of a filter system that may remove debris, dirt, dust, or other contaminants prior to using air as a cooling medium. In many cases, the louvers may be exposed to wind, rain, snow, sun, and other elements.

In many embodiments, the louvers may have various mechanisms for shedding rain, ice, snow, dirt, or other elements. For example, some embodiments may have a drip edge that may collect rain water or other condensation and drain the condensation to a collection point. Some embodiments may have various coatings, shapes, or other features that may shed snow, ice, dirt, water, or other objects in an effective manner.

The cross section of the louvers of embodiment 100 may reflect just one of many different designs. Since the passageways of embodiment 100 are near the middle of the louvers, any heated media passing through the passageways may help heat the upper surface of the louvers, causing ice or snow buildup to be sloughed off. Other designs may have different numbers of passageways, different shapes of the passageways, and different placement of the passageways.

The overall shape of the louvers of embodiment 100 may vary with different embodiments. While the shape of embodiment 100 may have a flat upper side with some formed features on the bottom side, other embodiments may have curved shapes, airfoil shapes, or other shapes.

Figure 2:
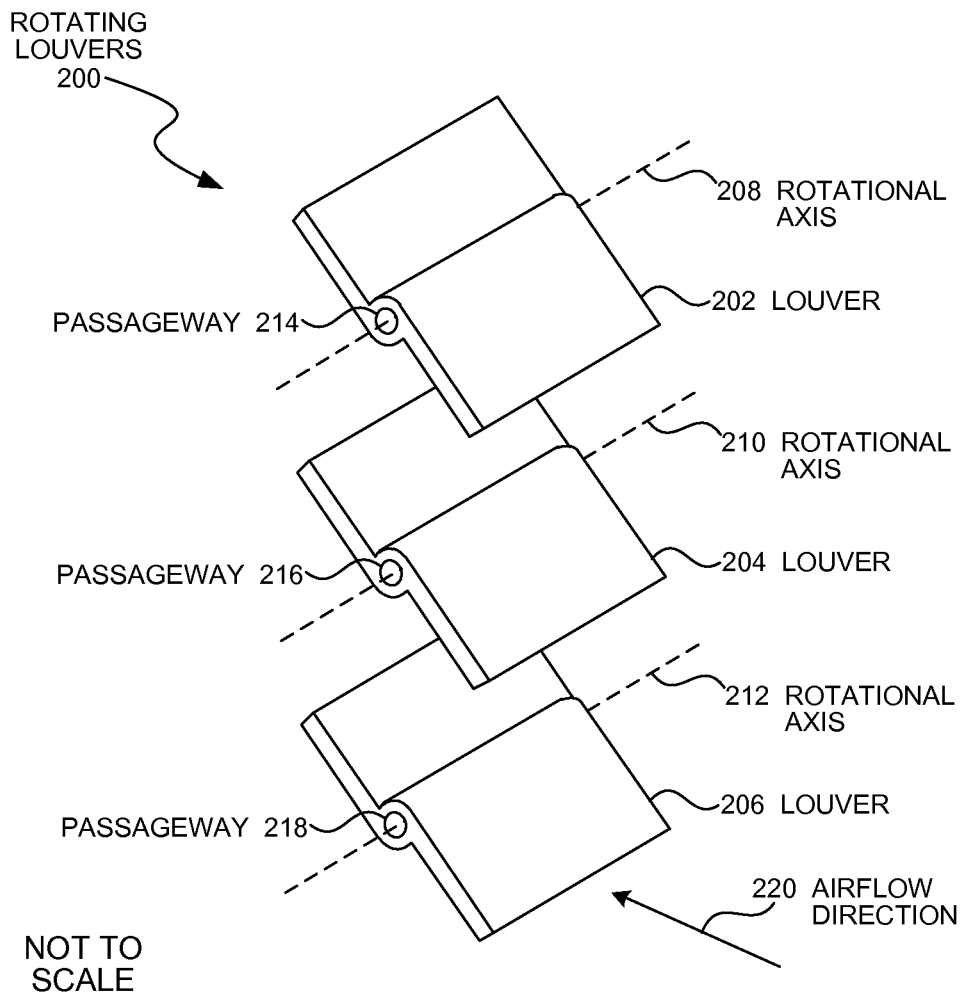
FIG. 2 is a perspective diagram of an example embodiment showing a set of heated louvers that may rotate about an axis.

FIG. 2 is a perspective diagram of an embodiment 200, showing a set of heated louvers that may be capable of rotating. Embodiment 200 is not to scale.

Embodiment 200 illustrates a set of louvers 202, 204, and 206. Each of the louvers may be capable of rotating about a rotational axis 208, 210, and 212, respectively. The louvers may have passageways 214, 216, and 218, that may be aligned with or coaxial to the respective rotational axis. The louvers are oriented to receive airflow in the direction 220.

Embodiment 200 illustrates another embodiment of louvers where the louvers may rotate to open and close. The rotational axis may be aligned with the passageways such that heating media may be passed through the passageways to warm the louvers.

The louvers of embodiment 200 may be configured to interlock, overlap, or otherwise operate together to close off an input vent to a datacenter. A rotation mechanism may be used to open and close one or more of the louvers together. In some embodiments, the louvers may be operated in a partially open position during periods of reduced airflow.

Figure 3:
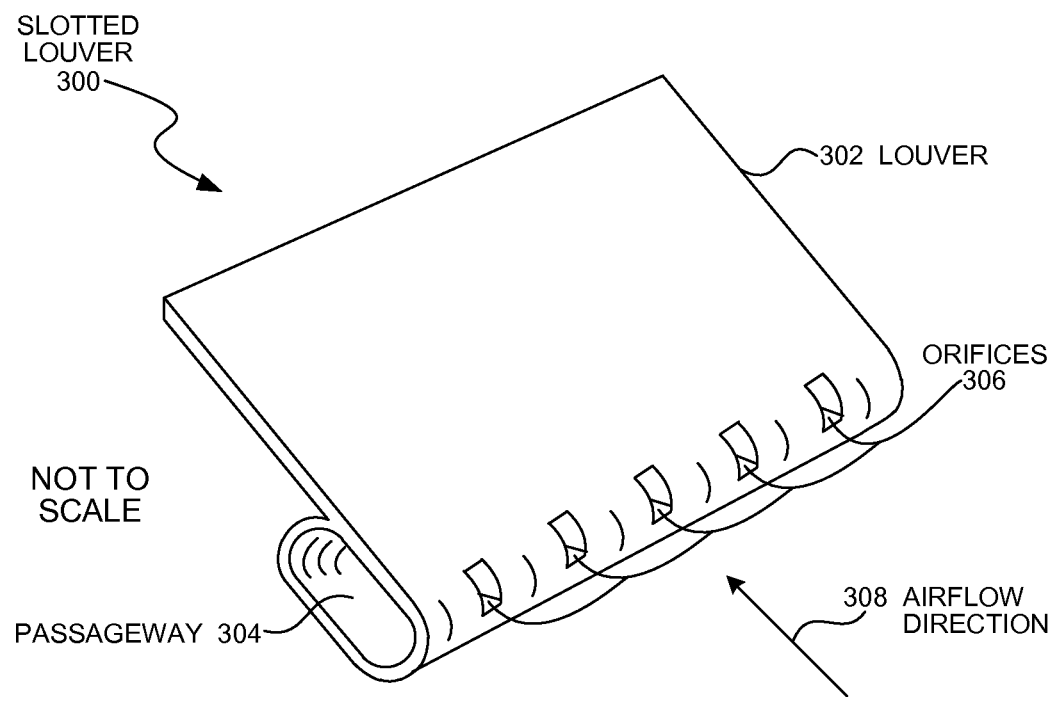
FIG. 3 is a perspective diagram of an example embodiment showing a heated louver with slots for expelling air.

FIG. 3 is a perspective diagram of an embodiment 300, showing a single louver with slots. Embodiment 300 is not to scale. The louver 302 is oriented for an airflow direction 308.

Embodiment 300 illustrates a single louver 302 that may have a passageway 304 and multiple orifices 306. The orifices 306 may allow air or other media from the passageway 304 to enter the airflow in the direction 308.

The shape of embodiment 300 may resemble an airfoil or other curved shape. In many cases, incoming air may cause ice or snow buildup along the leading edge of the louver 302. In order to more effectively melt such buildup, the passageway 304 may be oriented closer to the leading edge.

The orifices 306 may introduce heated air from the passageway 304 into the incoming airstream. The heated air may serve to preheat the incoming air in some cases, and may also more effectively eliminate ice or snow buildup along the leading edge of the louver 302.

The shape, spacing, and design of the orifices 306 may vary based on the amount of desired airflow, pressure of air in the passageway 304, size of the louver 302, expected operating temperatures, and other factors. In some cases, the orifices may be round, slotted, or other shapes. Some embodiments may have the orifices evenly spaced and oriented along the leading edge. Other embodiments may have the orifices spaced at varying intervals. Some embodiments may have the orifices placed along the top, bottom, or both sides of the louver.

Figure 4:
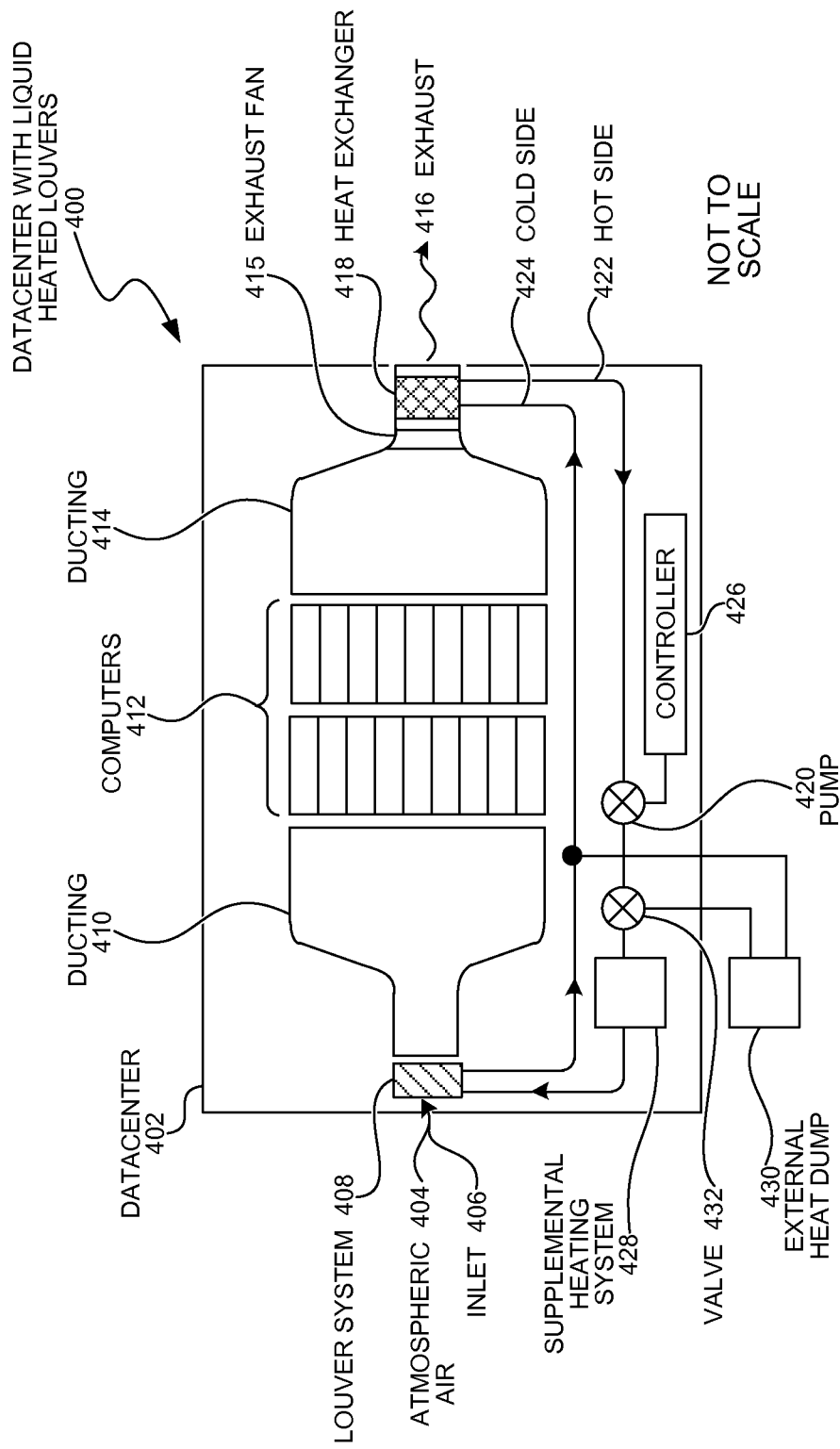
FIG. 4 is a diagram illustration of an embodiment showing a datacenter with liquid heated louvers.

FIG. 4 is a schematic diagram of an embodiment 400, showing a datacenter with liquid heated louvers. Embodiment 400 is not to scale.

Embodiment 400 illustrates a datacenter 402 that may use atmospheric air 404 to cool a set of computers 412.

A typical datacenter may have many computers, sometimes numbering in the thousands or even hundreds of thousands of computers. In many cases, the datacenter may be designed with groups of computers, each having an independent cooling system, an example of which may be embodiment 400.

The atmospheric air 404 may pass through an inlet 406 which may have a louver system 408 disposed across the inlet 406. The inlet 406 may accept outdoor air that may contain rain, snow, ice, sleet, hail, or any other type of precipitation or moisture. Additionally, the outdoor air may include other foreign bodies, such as leaves, sticks, dirt, animals, trash, or other items. The louver system 408 may act as a screen to prevent larger bodies from entering the datacenter 402. In many embodiments, a series of screens, filters, or other mechanisms may be used to remove debris and other items from the incoming air.

After passing through the louver system 408, the incoming air may pass through ducting 410 to cool the computers 412, then another series of ducting 414 where an exhaust fan 415 may draw the air towards an exhaust 416.

In the exhaust ducting, a heat exchanger 418 may capture heat from the computers 412 and transfer the heat to a heat exchange medium, which may be a liquid. The liquid may transfer heat from the heat exchanger 418 to the louver system 408 through a circuit having a hot side 422 and a cold side 424. The heat exchange medium may be pumped by a pump 420 to recirculate the heat exchange medium from the heat exchanger 418 to the louver system 408. Hot heat transfer medium may be passed through the louver system 408 and may return as cooled heat transfer medium, to be reheated by the heat exchanger 418.

In some embodiments, a supplemental heat system 428 may generate additional heat that may raise the incoming air above the lower operating temperature of the computers 412. The supplemental heat system 428 may be used in cases where the incoming temperature is lower than the lower operating temperature of the computers 412 and when the heat exchanger 418 may not be able to heat the liquid sufficiently. An example situation may occur when the computers 412 may be initially started. In such a case, the computers 412 may not be generating heat that may be captured by the heat exchanger 418.

Embodiment 400 may have an external heat dump 430 that may transfer heat from the heat transfer medium to atmosphere. The external heat dump 430 may be used in situations where the heat exchanger 418 causes the heat transfer medium to rise above a predetermined operating temperature.

A controller 426 may operate the pump 420 and other components of the louver system. The controller 426 may be a microprocessor based device that may operate software to control the various components. In some embodiments, the controller 426 may be a hardware device such as a logic array or other device that may have built in logic.

The controller 426 may monitor the outdoor temperature of the atmospheric air 404, as well as temperatures of the computers 412, heat exchanger 418, heat transfer media, and other components. The controller 426 may cause the pump 420 to cycle heated heat transfer media to the louver system 408 and, in some cases, operate the supplemental heating system 428 or the external heat dump 430.

Figure 5:
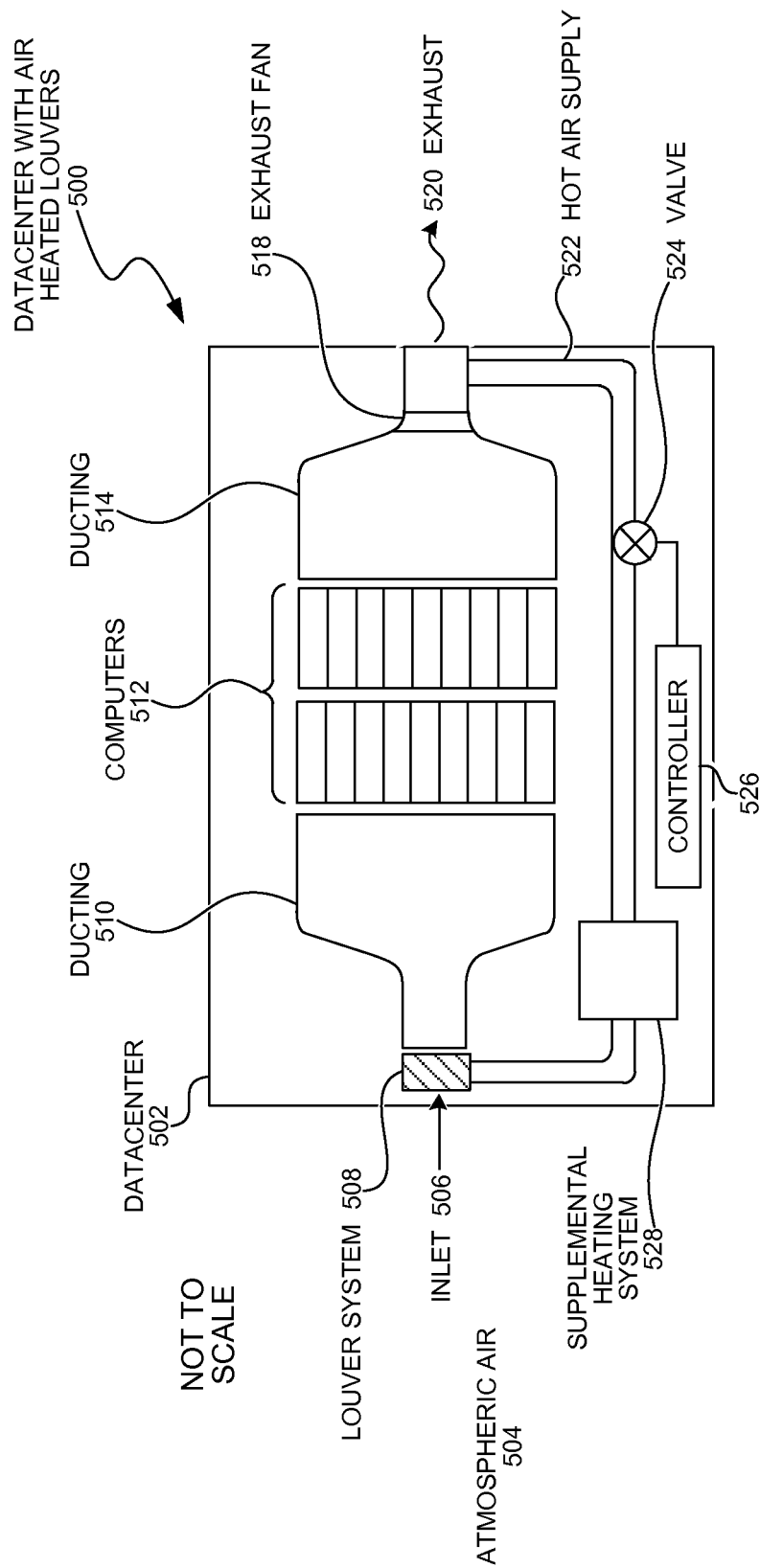
FIG. 5 is a diagram illustration of an embodiment showing a datacenter with air heated louvers.

FIG. 5 is a schematic diagram of an embodiment 500, showing a datacenter with air heated louvers. Embodiment 500 is not to scale. Embodiment 500 may be similar to embodiment 400, but may operate with air as a heat transfer medium for the louver system.

Embodiment 500 illustrates a datacenter 502 that may use atmospheric air 504 to cool a set of computers 512.

The atmospheric air 504 may pass through an inlet 506 which may have a louver system 508 disposed across the inlet 506.

After passing through the louver system 408, the incoming air may pass through ducting 510 to cool the computers 512, then another series of ducting 514 where an exhaust fan 518 may draw the air towards an exhaust 520.

In the exhaust ducting, ducting may pull off a hot air supply 522 which may capture air heated by the computers 512. The hot air supply 522 may pass through a valve 524 to produce hot air for the louver system 508. In some embodiments, the hot air supply 522 may pass through a supplemental heating system 528 which may further heat the air. In some embodiments, a fan or other impeller may be used within ducting for the hot air supply 522 to pressurize air supplied to the louver system 508.

In some embodiments, the louver system 508 may introduce hot air into the ducting 510 to preheat incoming air. In other embodiments, the heated air may pass through the louver system 508 and may be exhausted into the atmosphere without being introduced into the cooling airstream.

In some embodiments, the hot air supplied to the louver system 508 may be plumbed through a valve such that the hot air may be switched from being vented to atmosphere to being introduced into the cooling airstream.

Figure 6:
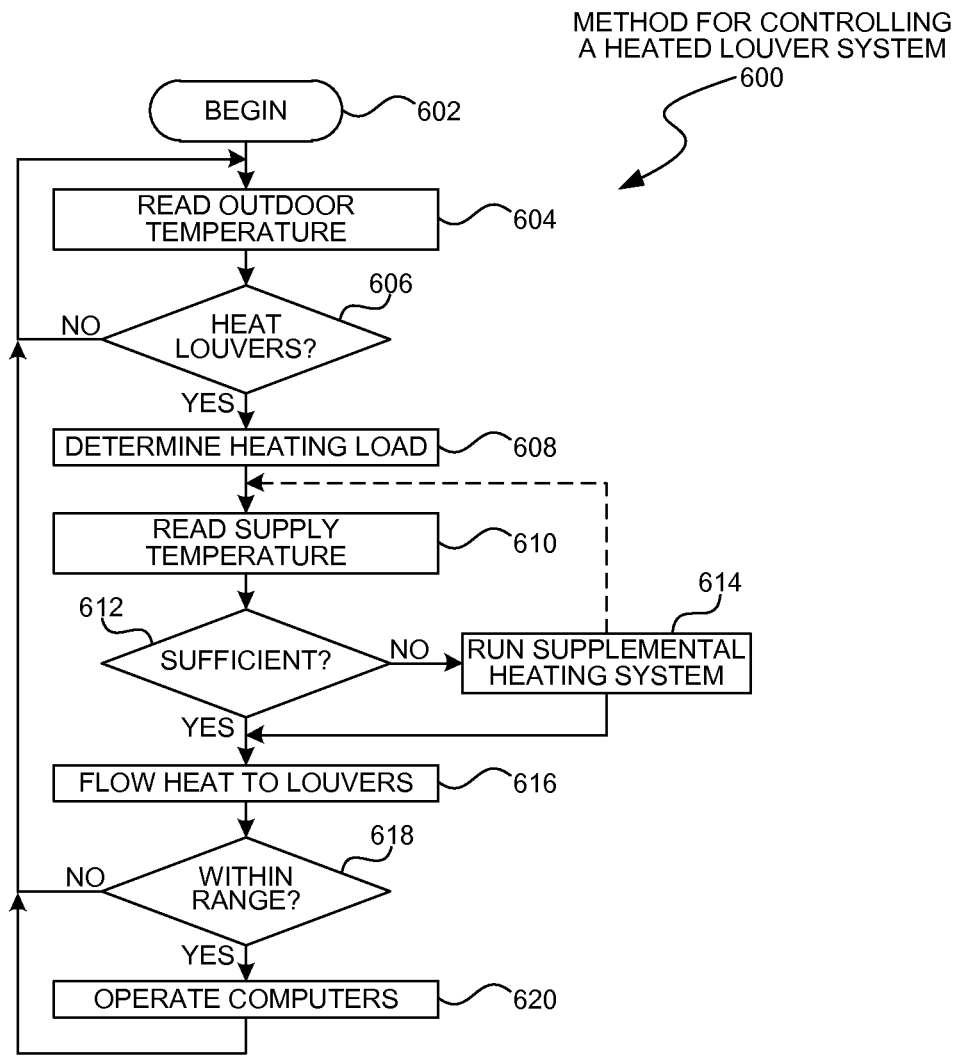
FIG. 6 is a flowchart illustration of an embodiment showing a method for controlling a heated louver system.

FIG. 6 is a flowchart illustration of an embodiment 600 showing a method for operating a heated louver system. The operations of embodiment 600 are a simplified example of a process performed by a controller, such as controllers 426 or 526 of embodiments 400 or 500, respectively.

Other embodiments may use different sequencing, additional or fewer steps, and different nomenclature or terminology to accomplish similar functions. In some embodiments, various operations or set of operations may be performed in parallel with other operations, either in a synchronous or asynchronous manner. The steps selected here were chosen to illustrate some principles of operations in a simplified form.

The operations of the controller may begin in block 602.

The outdoor temperature may be read in block 604. If the outdoor temperature does not indicate that the louvers may be heated in block 606, the controller may loop back to block 604 until such a temperature occurs.

Louver heating may be determined by various indicators in different embodiments. In the simple example of embodiment 600, the outdoor temperature may be the sole indicator. In other embodiments, humidity indicators, precipitation indicators, weather forecasts, ice or snow detectors, or other inputs may be considered to determine when to operate the heated louvers. In some embodiments, a controller may have various heuristics, algorithms, or other mechanisms for determining whether the heated louvers may be operated.

When the louver heating is indicated in block 606, the heating load expected by the heated louvers may be determined in block 608. The heating load may be calculated from the outside temperature, expected airflow, heat captured from computers within the datacenter, and other factors.

The supply temperature may be read in block 610. The supply temperature may be measured from a heat exchanger, hot air supply duct, or other mechanism that may capture heat from computers within the datacenter.

A minimum supply temperature may be calculated from the heating load analysis of block 608. If the supply temperature is not sufficient in block 612, a supplemental heating system may be run in block 614.

In some embodiments, the process may loop back to block 610 and may loop until the supply temperature may be sufficient in block 612. Such embodiments may be used when starting up the computers in a datacenter. In such situations, the computers may not be started until the incoming air temperature may be higher than a minimum operating temperature, which may be monitored as the internal temperature of one of the computers.

In other embodiments, the process may continue to block 616, where heat may be transferred to the louvers. In either type of embodiment, the louvers may be warmed in block 616.

If the operating temperature of the cooling airflow is within operating range in block 618, the computers within the datacenter may be operated in block 620. If the operating temperature is not within range in block 618, the process may return to block 604 until the operating temperature is within range.

Figure 7:
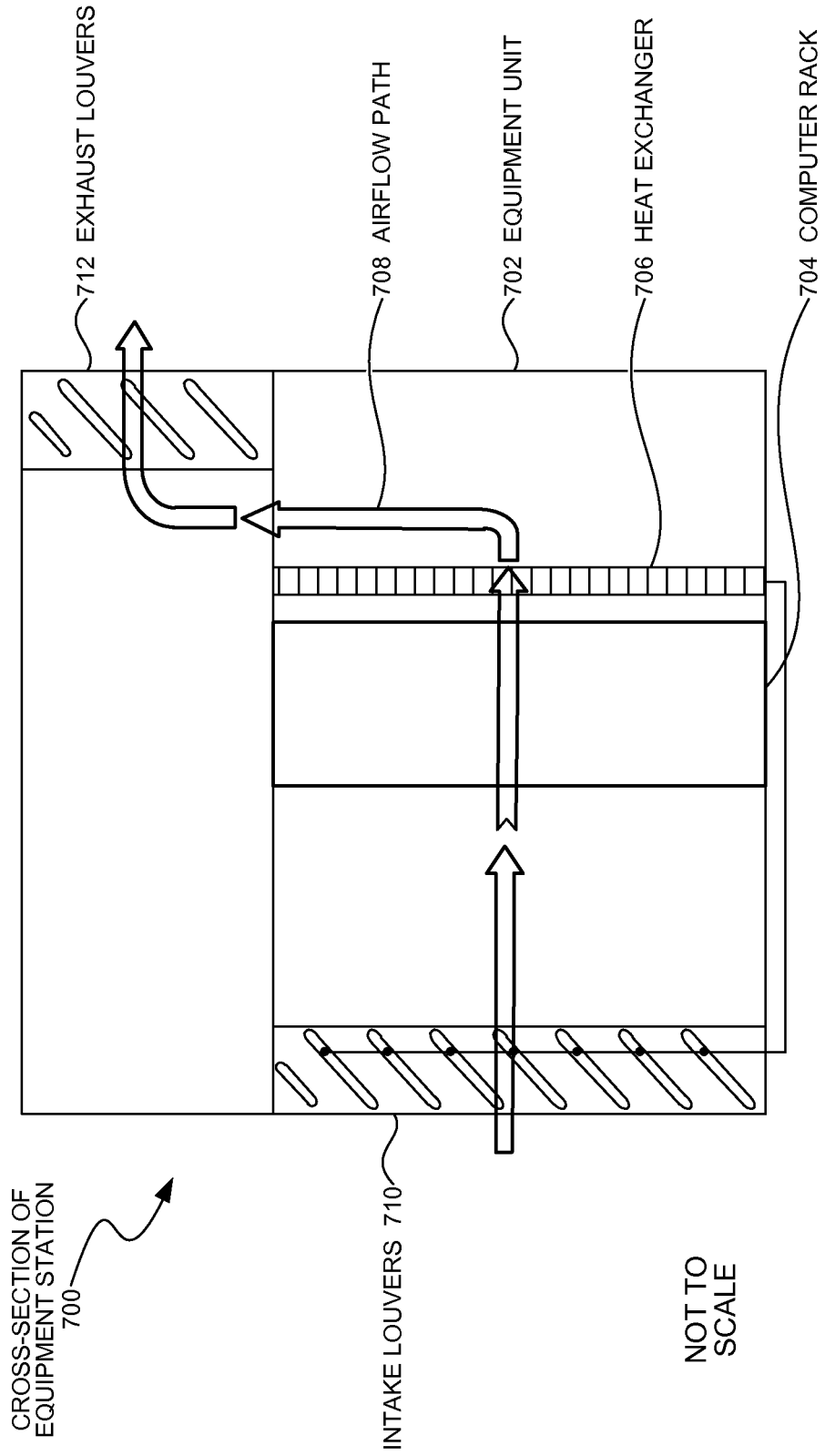
FIG. 7 is a diagram illustration of an embodiment showing an equipment unit with heated louvers.

FIG. 7 is a cross-sectional diagram showing an embodiment 700 of an example equipment unit. Embodiment 700 illustrates one use of a set of heated louvers and is not to scale.

Embodiment 700 shows a cross section of an equipment unit 702 that may be constructed from a shipping container or other portable container. The equipment unit 702 may be placed outdoors and may contain a computer rack 704. The equipment unit 702 may be deployed as local datacenters that may be placed outdoors. In order to increase computer capacity, multiple equipment units 702 may be placed together to scale up a small to medium sized datacenter.

The equipment unit 702 may contain a computer rack 704 in which multiple server computers may be mounted. An airflow path 708 may draw air through the computer rack 704 and a heat exchanger 706, then expel the air through exhaust louvers 712. In some embodiments, the exhaust louvers 712 may be operate as a heat exchanger to capture heat generated by the computer rack 704.

The heat exchanger 706 may capture heat created by the computer rack 704 and may supply the heat to the intake louvers 710. The heated intake louvers 710 may preheat the incoming air in some cases. The heated intake louvers 710 may also prevent buildup of ice, snow, condensation, and other moisture depending on the weather conditions. In some embodiments, the heat may be transferred using a recirculating liquid heat transfer medium. In other embodiments, the heat may be transferred using heated air.

The foregoing description of the subject matter has been presented for purposes of illustration and description. It is not intended to be exhaustive or to limit the subject matter to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments except insofar as limited by the prior art.

What is claimed is:

1. A heat exchange system for a datacenters comprising:
   a plurality of computer systems;
   a heat collection system located downstream from said plurality of computer systems, said heat collection system that removes heat from said plurality of computer systems and heats a heat transfer medium; and
   a heated louver system located upstream from said plurality of computer systems, said heated louver system comprising:
      an inlet port that accepts atmospheric air;
      a plurality of louvers over said input port, each of said louvers having at least one heat transfer passageway to accept said heat transfer medium;
      a supplemental heat generation system that heats said heat transfer medium; and
      a controller that:
         receives an outdoor temperature;
         causes said heat transfer medium to pass through said heat transfer passageway based at least in part on said outdoor temperature;
         determines an internal temperature for at least one of said plurality of computer systems;
         determines whether said internal temperature is lower than a predetermined value; and
         causes said supplemental heat generation system to produce said heat until said internal temperature reaches said predetermined value when it is determined that said internal temperature is lower than said predetermined value.

2. The system of claim 1, each of said plurality of louvers having a rotational axis and being controllable by said controller to rotate about said rotational axis.

3. The system of claim 2, each of said plurality of louvers having one of said heat transfer passageway.

4. The system of claim 3, said heat transfer passageway being oriented coaxial with said rotational axis.

5. The system of claim 4, said louvers being rotatable into a closed position.

6. The system of claim 1, said heat transfer medium being a liquid.

7. The system of claim 1, said louvers being constructed at least in part of an extrusion.

\* \* \* \* \*